United States Patent
Tuerpe

(10) Patent No.: US 11,658,045 B2
(45) Date of Patent: May 23, 2023

(54) METHOD FOR THE PRODUCTION OF AN ELECTRONIC ARRANGEMENT AND THE ELECTRONIC ARRANGEMENT

(71) Applicant: Mahle International GmbH, Stuttgart (DE)

(72) Inventor: Matthias Tuerpe, Ludswigsburg (DE)

(73) Assignee: Mahle International GmbH

( * ) Notice: Subject to any disclaimer, the term of this patent is extended or adjusted under 35 U.S.C. 154(b) by 0 days.

(21) Appl. No.: 17/094,798

(22) Filed: Nov. 10, 2020

(65) Prior Publication Data

US 2021/0143023 A1 May 13, 2021

(30) Foreign Application Priority Data

Nov. 11, 2019 (DE) .......................... 102019217386.1

(51) Int. Cl.
*H01L 21/48* (2006.01)
*H01L 23/373* (2006.01)
(Continued)

(52) U.S. Cl.
CPC ...... *H01L 21/4882* (2013.01); *H01L 23/3735* (2013.01); *H01L 23/46* (2013.01); *H05K 7/209* (2013.01); *H05K 7/20927* (2013.01)

(58) Field of Classification Search
CPC . H01L 21/4882; H01L 23/3735; H01L 23/46; H01L 23/473; H05K 7/2039;
(Continued)

(56) References Cited

U.S. PATENT DOCUMENTS

2011/0070695 A1* 3/2011 Bayerer .................. H01L 24/83
  438/107
2013/0328204 A1* 12/2013 Zommer .................. H01L 23/52
  228/205

(Continued)

FOREIGN PATENT DOCUMENTS

DE 102006009159 A1 8/2007
DE 102009029577 B3 4/2011
(Continued)

OTHER PUBLICATIONS

English abstract for DE-102006009159.
English abstract for DE-102013204883.
English abstract for EP-2390914.

*Primary Examiner* — Patricia D Valenzuela
(74) *Attorney, Agent, or Firm* — Fishman Stewart PLLC

(57) ABSTRACT

A method for producing an electronic arrangement includes providing an aluminium body and a power electronic unit. The power electronic unit includes a base plate and an electronic component. The method includes pre-treating a joining region of a main surface of the aluminium body; coating the pre-treated joining region with a sinter paste including at least one of copper particles and silver particles; positioning the power electronic unit with a second side of the base plate on the main surface of the aluminium body; joining the power electronic unit and the aluminium body in the joining region with supply of heat, wherein the aluminium body and the power electronic unit are connected via the sinter paste in a materially bonded and heat-transferring manner.

20 Claims, 1 Drawing Sheet

(51) Int. Cl.
*H01L 23/46* (2006.01)
*H05K 7/20* (2006.01)

(58) Field of Classification Search
CPC .... H05K 7/205; H05K 7/20509; H05K 7/209; H05K 7/20927
See application file for complete search history.

(56) References Cited

U.S. PATENT DOCUMENTS

2018/0290224 A1* 10/2018 Schmidgall ........ H05K 7/20927
2019/0098743 A1*  3/2019 Molla ................. H01L 23/3735

FOREIGN PATENT DOCUMENTS

| | | |
|---|---|---|
| DE | 102013204883 A1 | 9/2014 |
| DE | 102017205813 A1 | 10/2018 |
| EP | 2390914 A1 | 11/2011 |

* cited by examiner

METHOD FOR THE PRODUCTION OF AN ELECTRONIC ARRANGEMENT AND THE ELECTRONIC ARRANGEMENT

CROSS-REFERENCE TO RELATED APPLICATION

This application claims priority to German Application No. DE 10 2019 217 386.1 filed Nov. 11, 2019, the contents of which are hereby incorporated by reference in its entirety.

TECHNICAL FIELD

The invention relates to a method for the production of an electronic arrangement and the electronic arrangement.

BACKGROUND

In particular in the hybridisation of the powertrain for vehicles, the cooling of electronic components is important. Usually, electronic components are soldered-on on one side on a ceramic plate which is copper-coated on both sides—a so-called DCB substrate (DCB: direct copper bonded), and are thereby electrically interconnected with one another. The ceramic plate with the soldered-on electronic components can then be attached on the other side to a copper body—a so-called heat sink—in a materially bonded and heat-transferring manner. Thereby, an electronic arrangement is formed in which heat which is generated in the electronic components is transported toward the exterior via the copper body and the electronic components are thereby cooled. The copper-coated ceramic plate and the copper body are usually joined to one another here by a soft soldering process or a silver powder sintering process. Currently, for cost reasons, however, there is an aim to replace the copper body by an aluminium body. However, disadvantageously, the copper-coated ceramic plate can not be directly connected with the aluminium body by conventionally known joining techniques. The reason for this are stable oxide layers on the aluminium body, which prevent or respectively make difficult the soft soldering process with the copper-coated ceramic plate.

A number of approaches are known for circumventing this problem. For example, a nickel plate can be connected with the aluminium body by means of a CAB soldering process (CAB: Controlled Atmosphere Brazing) and the copper-coated ceramic plate can then be subsequently soldered on the nickel plate. Disadvantageously, nickel has a lower thermal conductivity than copper and thereby the carrying away of waste heat is negatively influenced. Furthermore, the nickel plate is connected with the aluminium plate in an additional step and has a high cost. Thereby, costs of the electronic arrangement are disadvantageously increased. Basically also a copper plate could be used instead of a nickel plate. A direct joining of copper and aluminium is very laborious, however, and requires additional facilities, which in the same way increases costs of the electronic arrangement. The same applies to the approach in which a soldered-on copper plate is replaced by thermally sprayed-on copper. Here, copper is applied onto individual defined surfaces of the aluminium body by means of thermal spraying. The approach to connect the copper-coated ceramic plate with the aluminium body by means of a silver powder sintering process is also known. Here, individual defined surfaces of soldered-on nickel plates or thermally sprayed-on copper are produced on the aluminium body, and the ceramic plate is then connected with the aluminium body in these surfaces by means of a silver powder sintering process. Here, however, an expensive component is used which distinctly increases the costs of the electronic arrangement. Furthermore, the silver powder sintering process must take place under pressure here, which also requires additional facilities.

Alternatively, instead of the DCB substrate, a so-called IMS (IMS: Insulated Metal Substrate) can be used. The IMS is formed for example by a steel plate or an aluminium plate, onto which a dielectric insulating layer is applied on one side. The insulating layer on the metal plate is then copper-coated, so that IMS is able to be used in an analogous manner to DCB substrate. However, with the IMS the problem exists in addition that only the steel plate can be soldered or sintered onto the aluminium body in the region of the soldered-on nickel plate or in the region of the thermally sprayed-on copper. If the metal plate in the IMS is formed from aluminium, then this is not possible for the above-mentioned reasons.

SUMMARY

In summary, no solution is known hitherto which enables a favourably priced and simplified joining of the aluminium body and the copper-coated ceramic plate or metal plate using already existing facilities.

The object of the invention is therefore to indicate for a method for producing an electronic arrangement of the generic type an improved or at least alternative embodiment, in which the described disadvantages are overcome. It is also the object of the invention to provide a corresponding electronic arrangement.

These problems are solved according to the invention by the subject of the independent claims. Advantageous embodiments are the subject of the dependent claims.

The method according to the invention is provided for producing an electronic arrangement. The electronic arrangement comprises here a plate-like aluminium body and at least one power electronic unit. The at least one power electronic unit comprises a base plate with a first contact side and with a second contact side lying opposite the first contact side, and at least one electronic component. At least the first contact side of the base plate is coated with a copper coating. Here, the electronic component is soldered-on or sintered-on onto the copper coating on the first contact side of the base plate. The base plate, and thereby the power electronic unit are connected in a materially bonded and heat-transferring manner with a main surface of the aluminium body on the second contact side.

In connection with the present invention, the term "plate-like" is to be understood to mean that a height of the aluminium body, determined in vertical direction, is much smaller than its width and its length. Thereby, the aluminium body has two main surfaces extending transversely to the vertical direction, which are spaced apart, opposite one another and with respect to one another in vertical direction. This also applies to the base plate, in which then the two contact sides extend transversely to the vertical direction and are spaced with respect to one another in vertical direction. The aluminium body—or a so-called heat sink—can be formed here from aluminium, from an aluminium alloy or from an aluminium-plastic composite. The aluminium body can be, for example, a flat tube which is able to be flowed through by a cooling fluid, so that the power electronic unit can be cooled better. In connection with the present invention, the term "materially bonded"—in the sense of a metallurgical or cohesive connection—means that the connection between the power electronic unit and the aluminium body is not detachable. In particular, this connection can only be separated by the destruction of connection means.

The base plate carries on the first contact side the at least one electronic component which is soldered-on or sintered-on on the copper coating. Expediently, the copper coating can be structured on the first contact side of the base plate, and can have for example conductor tracks for the respective electronic component. It shall be understood that the power electronic unit can also have several electronic components which are electrically interconnected with one another on the first contact side of the base plate by means of the structured copper coating. With the second contact side—therefore facing away from the at least one electronic component—the base plate, and thereby the power electronic unit, is secured on the aluminium body in a materially bonded and heat-transferring manner.

Expediently, the copper coating on the first contact side and thereby the electronic component are electrically insulated from the aluminium body by means of the base plate. The base plate can be, for example, a ceramic plate which is preferably formed from an $Al_2O_3$ ceramic. The ceramic plate has dielectric characteristics here, so that the copper coating is electrically insulated from the aluminium body. The ceramic plate can be coated here on the second contact side with a further copper coating, wherein the two copper coatings are then separated from one another via the electrically insulating ceramic plate. The ceramic plate with the two copper coatings then represents a so-called DCB substrate. Alternatively, the base plate can be a metal plate with an insulating layer which is applied, facing the electronic component, onto the metal plate. The metal plate is then preferably formed from steel or aluminium. The copper coating is then applied onto the insulating layer of the metal plate. The electrically insulated side of the metal plate then represents the first contact side of the base plate. Through the insulating layer, the copper coating and thereby the electronic component are electrically insulated from the metal plate and from the aluminium body. The metal plate with the insulating layer and with the copper coating then represents a so-called IMS.

The method according to the invention comprises several steps. Firstly, a pre-treating of a joining region of the main surface of the aluminium body for the respective power electronic unit is carried out. On the pre-treating of the main surface, the latter is prepared in the joining region for the subsequent joining. Thus, the main surface can be cleaned, for example. Alternatively or additionally, during the pre-treating existing oxide layers in the joining region can be removed, so that new, thin and uniform oxide layers can form in the joining region. The joining region can extend here over the entire main surface or over a portion of the main surface of the aluminium body. Advantageously, provision can be made that the pretreating of the joining region takes place by a chemical etching or by a mechanical abrasion, in particular by a laser abrasion.

A coating of the pre-treated joining region of the main surface with a sinter paste is then carried out. The sinter paste comprises here copper particles and/or silver particles, which in particular have a diameter in the nano- and micrometre range. The sinter paste can therefore have only copper particles, or alternatively only silver particles, or alternatively copper particles and silver particles. In addition to the copper particles and/or the silver particles, the sinter paste can also have organic binders and further components. When the sinter paste has the copper particles, it can be constituted so that the copper particles, specifically the copper particles with the diameter in the nanometre range, only occur with a supply of heat during the subsequent joining. In other words, the sinter paste can comprise chemical compounds which during the subsequent joining with the supply of heat or respectively in situ form the copper particles in particular with the diameter in the nanometre range. Usually, the copper particles tend toward an intensive oxidation which can negatively impair the subsequent joining. This problem can be advantageously circumvented through such a sinter paste. When the sinter paste has the silver particles, it can be constituted so that the silver particles, specifically the silver particles with the diameter in the nanometre range, only occur with the supply of heat in the subsequent joining. To simplify the description, the term "sinter paste with copper particles and/or silver particles" is always used in the following, although the copper particles and/or silver particles—as described above—can also only occur in situ. Irrespective of its constitution, the sinter paste serves as a binder between the aluminium body and the second contact side of the base plate.

Advantageously, the coating of the joining region with the sinter paste can take place by a wet chemical coating, in particular by screen printing. Advantageously, during the coating, the sinter paste with copper particles and/or with silver particles with a diameter of between 10 nm and 1000 µm can be used. The proportion of the copper particles and/or of the silver particles with the diameter in the nanometre range—therefore with the diameter between 10 nm and 1000 nm—can lie between 0.5 mass % and 50 mass %. Advantageously, during the coating of the joining region with the sinter paste, the latter can be applied directly onto the aluminium body. Thereby, nickel plates or copper plates, which are conventionally used as connection means between the aluminium body and the power electronic unit, are omitted. Thereby, costs of the method and thereby of the electronic arrangement can be reduced.

After the coating, a positioning of the power electronic unit on the main surface of the aluminium body in the coated joining region is carried out. In so doing, the power electronic unit is positioned with the second contact side of the base plate—therefore with the contact side of the base plate facing away from the electronic component—on the aluminium body. In so doing, the power electronic unit is placed in the joining region with the second contact side onto the sinter paste. When the base plate is formed by a ceramic plate and is coated on both sides with the copper coatings, the copper coating which is applied on the second contact side then lies on the sinter paste. When the base plate is a metal plate with the insulating layer applied on one side, the metal plate then lies directly—therefore with its material without further intermediate layers—on the sinter paste. Preferably, the joining region, the applied sinter paste and the base plate correspond to one another in terms of area and in terms of shape. In other words, shapes and areas of the joining region of the main surface, of the applied sinter paste and of the second contact side of the base plate are adapted to one another in such a way that the base plate can be joined with the aluminium body over the entire surface.

Subsequently, a joining of the power electronic unit and of the aluminium body is carried out in the joining region, with supply of heat. Thereby, the aluminium body and the power electronic unit are connected in a materially bonded and heat-transferring manner by means of the sinter paste. On joining, a permanent materially bonded connection is achieved through specific reactions and diffusion of the copper particles and/or of the silver particles of the sinter paste—and in particular of the copper particles and/or of the silver particles with the diameter in the nanometre range—between the sinter paste and the power electronic unit and between the sinter paste and the aluminium body. When the base plate is formed by a ceramic plate and the ceramic plate is coated on both sides with the copper coatings, then the sinter paste and the copper coating are connected in a materially bonded manner at the interface between the sinter paste and the power electronic unit. When the base plate is a metal plate with the insulating layer applied on one side, then the sinter paste and the material of the metal plate are connected in a materially bonded manner at the interface between the sinter paste and the power electronic unit. The material of the metal plate can be steel or aluminium here, and accordingly the sinter paste can be connected in a materially bonded manner with the steel or with the aluminium. At the interface between the sinter paste and the aluminium body a so-called seam is formed between the sinter paste, oxide layer of the aluminium body and the material of the aluminium body. Thereby, a permanent connecting can be achieved between the aluminium body and the power electronic unit. It shall be understood that the sinter paste is fluid or respectively pasty before the joining, and forms a solid sinter layer after the joining, which then connects the power electronic unit and the aluminium body in a materially bonded and heat-transferring manner.

Advantageously, the joining of the power electronic unit and of the aluminium body can take place in a pressureless or almost pressureless manner. In this context, the term "pressureless" means that for joining the aluminium body and the power electronic unit no external pressure—which can conventionally amount to up to 50 MPa—is applied thereto. In other words, the aluminium body and the power electronic unit are not additionally pressed against one another. Thereby, the load of the at least one electronic component and of the base plate on joining can be advantageously reduced. Advantageously, in the method the joining can take place at a temperature between 150° C. and 250° C. Thereby, thermal load of the at least one electronic component and of the base plate on joining can be advantageously reduced.

Through the method according to the invention, the number of the required layers or respectively connection means can be reduced. Facilities conventionally used for the joining of the aluminium body and of the power electronic unit by means of silver powder sintering process can continue to be used here.

Advantageously during the pre-treating several joining regions of the main surface can be pre-treated simultaneously or in succession. Then, during the coating, these several pretreated joining regions of the main surface can be coated with the sinter paste of copper particles and/or of silver particles, which in particular have the diameter in the nano- and micro-metre range. Then, during the positioning, several power electronic units can be positioned with the respective second contact side of the base plate on the main surface of the aluminium body in the respective coated joining regions. Subsequently, during the joining, the respective several power electronic units and the aluminium body can be connected with one another in a materially bonded and heat-transferring manner. In this advantageous manner, an electronic arrangement can be produced in which several power electronic units are secured on the main surface in a materially bonded and heat-transferring manner. Thereby, several electronic components of these power electronic units can be cooled by the same aluminium body.

It is conceivable that the aluminium body can also be connected on both sides—therefore on its opposite main surfaces—with respectively at least one power electronic unit in a materially bonded and heat-transferring manner. It is also conceivable that the aluminium body can also be connected on both sides with respectively several power electronic units in a materially bonded and heat-transferring manner. In addition, it is conceivable that the respective power electronic unit has several electronic components which are electrically interconnected with one another.

The invention also relates to an electronic arrangement with a plate-like aluminium body and with at least one power electronic unit. The at least one power electronic unit comprises a base plate with a first contact side and with a second contact side lying opposite the first contact side, and at least one electronic component. At least the first contact side is coated with a copper coating. The electronic component is then soldered-on or sintered-on onto the copper coating on the first contact side of the base plate. The ceramic plate and thereby the power electronic unit are connected on the second contact side with a main surface of the aluminium body in a materially bonded and heat-transferring manner. According to the invention, the electronic arrangement is produced by the method described above.

Expediently, the copper coating on the first contact side and thereby the electronic component are electrically insulated from the aluminium body by means of the base plate. The base plate can be, for example, a ceramic plate which is preferably formed from an $Al_2O_3$ ceramic. The ceramic plate has dielectric characteristics here, so that the copper coating is electrically insulated from the aluminium body. The ceramic plate can be coated here on the second contact side with a further copper coating, wherein the two copper layerings are then separated from one another via the electrically insulating ceramic plate. The ceramic plate with the two copper coatings then constitutes a so-called DCB substrate. Alternatively, the base plate can be a metal plate with an insulating layer which is applied, facing the electronic component, onto the metal plate. The metal plate is then preferably formed from steel or aluminium. The copper coating is then applied onto the insulating layer of the metal plate and thereon the at least one electronic component is then soldered-on or sintered-on. The electrically insulated side of the metal plate then represents the first contact side of the base plate. Through the insulating layer, the copper coating and thereby the electronic component are electrically insulated from the metal plate and from the aluminium body. The metal plate with the insulating layer and with the copper coating then represents a so-called IMS. In order to avoid repetitions, reference is to be made at this point to the above description of the electronic arrangement.

Further important features and advantages of the invention will emerge from the subclaims, from the drawings and from the associated figure description with the aid of the drawings.

It shall be understood that the features mentioned above and to be explained further below are able to be used not only in the respectively indicated combination, but also in other combinations or in isolation, without departing from the scope of the present invention.

Preferred example embodiments of the invention are illustrated in the drawings and are explained further in the following description, wherein the same reference numbers refer to identical or similar or functionally identical components.

BRIEF DESCRIPTION OF THE DRAWINGS

There are shown, respectively schematically

DETAILED DESCRIPTION

Figure 1:
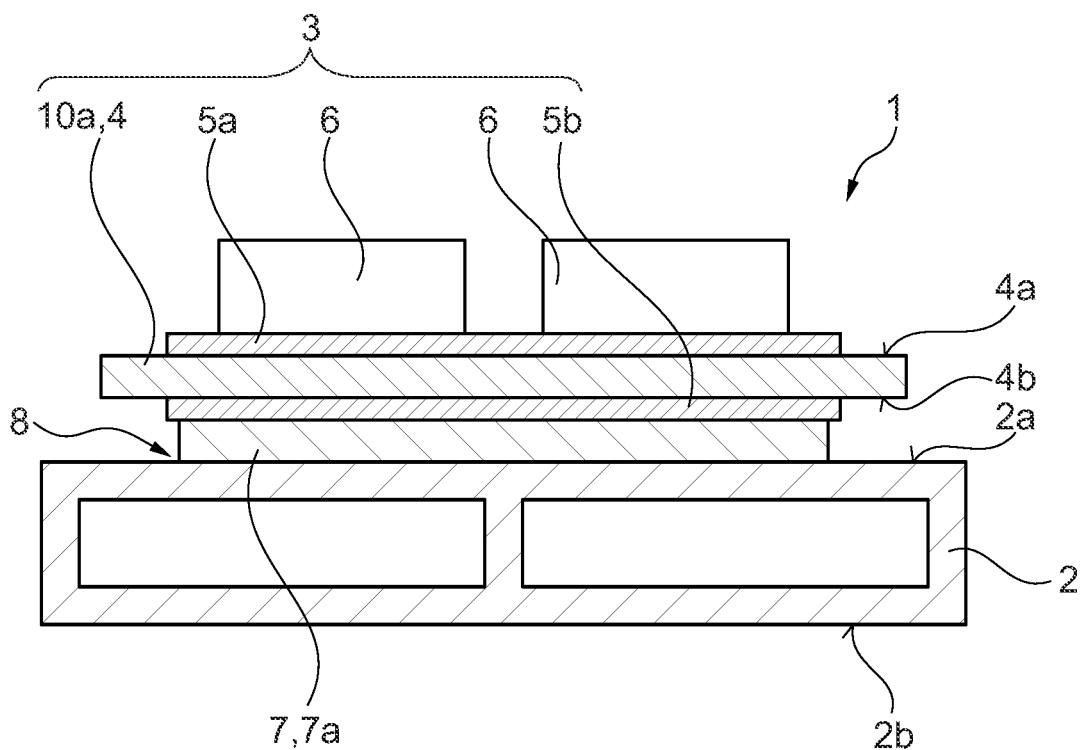
FIG. 1 a sectional view of an electronic arrangement according to the invention, which was produced in a method according to the invention.

FIG. 1 shows an electronic arrangement 1 according to the invention, which was produced in a method according to the invention. The electronic arrangement 1 has a plate-like aluminium body 2 and a power electronic unit 3. The aluminium body 2 has two main surfaces 2a and 2b lying opposite one another. The aluminium body 2 is able to be flowed through by cooling fluid, so that the power electronic unit 3 can be cooled intensively. The power electronic unit 3 comprises here a base plate 4, which is copper-coated on both sides. In other words, the base plate 4 has respectively a copper coating 5a and 5b on both sides. The base plate 4 here is a ceramic plate 10a. The ceramic plate 10a, which is copper-coated on both sides, constitutes a so-called DCB substrate. Electronic components 6 are soldered-on or sintered-on onto the copper coating 5a on the contact side 4a of the base plate 4 and are thereby interconnected with one another electrically. Expediently, the copper coating 5a is structured and has for example conductor tracks for the respective electronic component 5. The copper coating 5b, on the other hand, can be applied onto the base plate 4 over the entire surface. The contact side 4a is arranged here facing away from the aluminium body 1 and from its main surface 2a. The copper-coated base plate 4 with the electronic components 6 forms the power electronic unit 3. The latter is connected in a materially bonded and heat-transferring manner on the contact side 4b of the base plate 4 via a sinter layer 7a of a sinter paste 7 of copper particles and/or of silver particles which is activated and solidified on joining, whereby the electronic arrangement 1 is now formed. The power electronic unit 3 is secured here in a joining region 8 on the main surface 2a.

Expediently, the base plate 4 is coated on both sides with copper coatings 5a and 5b before carrying out the method according to the invention. Expediently, the electronic components 6 are also soldered-on or sintered-on onto the copper coating 5a on the first contact side 4a of the base plate 4 before the method according to the invention. In other words, the power electronic unit 3 is produced before the carrying out of the method according to the invention, and is tested for its functionality if applicable. The aluminium body 2 is also expediently produced before the carrying out of the method according to the invention. In the method according to the invention, the joining region 8 of the main surface 2a of the aluminium body 2 for the power electronic unit 3 is then firstly pre-treated. The pre-treated joining region 8 of the main area 2a is coated thereafter with the sinter paste 7 and the power electronic unit 3 is positioned with the copper coating 5b on the contact side 4b of the base plate 4 on the main surface 2a of the aluminium body 2 in the coated joining region 8. Thereby, the base plate 4 lies with the copper coating 5b or respectively with the copper-coated contact side 4b on the sinter paste 7. Subsequently, the power electronic unit 3 and the aluminium body 2 are joined in the joining region 8 with supply of heat and preferably in a pressureless manner. On joining, the solid sinter layer 7a of the fluid or respectively pasty sinter paste 7 then results. Through the characteristics of the sinter paste 7, a materially bonded and heat-transferring connecting of the power electronic unit 3 and of the aluminium body then takes place in the joining region 8.

Figure 2:
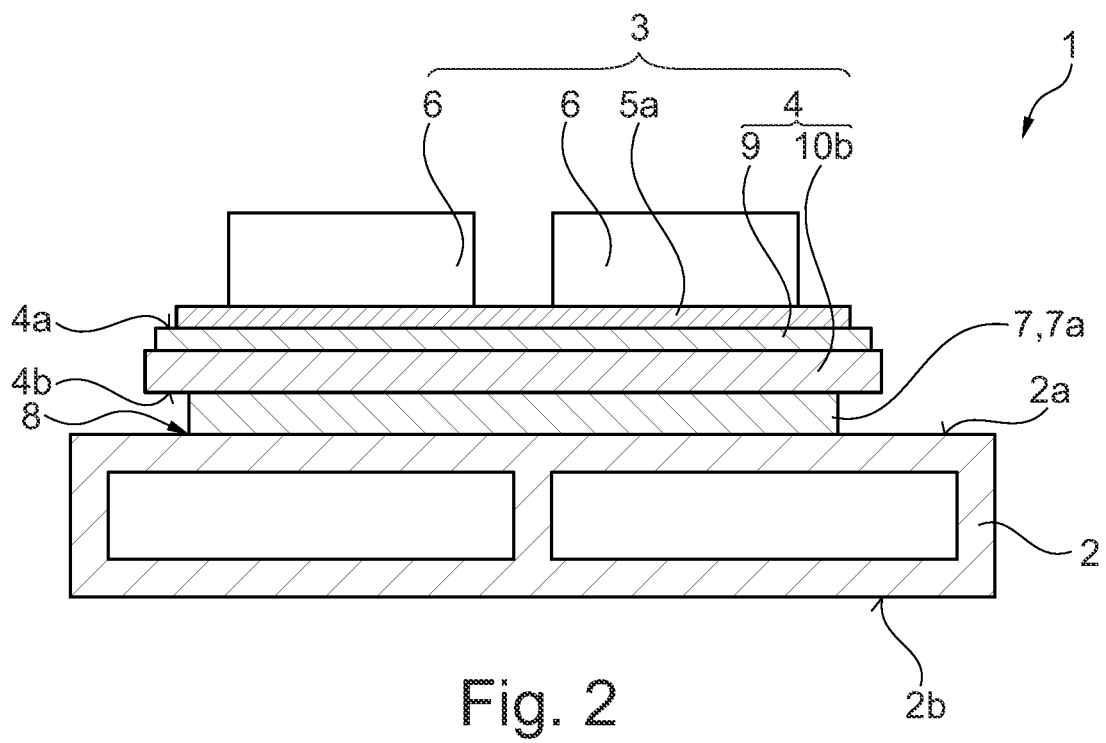
FIG. 2 a sectional view of the alternative electronic arrangement according to the invention, which was produced in the method according to the invention.

FIG. 2 now shows the electronic arrangement 1 according to the invention, which was produced in the method according to the invention. Here, deviating from the electronic arrangement 1 in FIG. 1, the base plate 4 of the power electronic unit 3 is configured differently. The base plate 4 has here a metal plate 10b—for example of aluminium or steel—and an electrically-insulating insulating layer 9, which is applied onto the metal plate 10b over the entire surface. The insulating layer 9 then electrically insulates the copper coating 5a from the metal plate 10b. Thereby, the copper coating 5a and the electronic component 6 are also electrically insulated from the aluminium body 2. Otherwise, the electronic arrangement 1 which is shown here corresponds to the electronic arrangement 1 in FIG. 1 and can be produced in the method described above.

The invention claimed is:

1. A method for producing an electronic arrangement, comprising:
    providing a plate-like aluminium body and at least one power electronic unit,
    wherein the at least one power electronic unit has a base plate with a first contact side and a second contact side lying opposite thereto, and at least one electronic component,
    wherein at least the first contact side of the base plate is coated with a copper coating,
    wherein the at least one electronic component on the first contact side of the base plate is soldered-on or sintered-on onto the copper coating,
    wherein the base plate and the power electronic unit with the second contact side are connected with a main surface of the aluminium body in a materially bonded and heat-transferring manner,
    further including the following steps in the following sequence:
    pre-treating a joining region of the main surface of the aluminium body for the at least one power electronic unit,
    coating the pre-treated joining region of the main surface with a sinter paste including at least one of copper particles and silver particles,
    positioning the at least one power electronic unit with the second contact side of the base plate on the main surface of the aluminium body in the coated pre-treated joining region,
    joining the at least one power electronic unit and the aluminium body in the coated pre- treated joining region with a supply of heat, wherein the aluminium body and the at least one power electronic unit are connected via the sinter paste in a materially bonded and heat-transferring manner, and
    wherein the supply of heat is applied to the sinter paste after the positioning of the at least one power electronic unit on the aluminum body such that the sinter paste is fluid or pasty before the joining and forms a solid sinter layer after the joining to connect the at least one power electronic unit to the aluminium body.

2. The method according to claim 1, wherein the pre-treating of the joining region takes place by a chemical etching or by a mechanical abrasion.

3. The method according to claim 1, wherein the joining takes place at a temperature between 150° C. and 250° C.

4. The method according to claim 1, wherein the coating of the joining region with the sinter paste takes place by a wet chemical coating.

5. The method according to claim 1, wherein during the coating of the joining region with the sinter paste, the sinter paste is applied directly onto the aluminium body.

6. The method according to claim 1, wherein the joining of the at least one power electronic unit and of the aluminium body takes place in a pressureless or almost pressureless manner.

7. The method according to claim 1, wherein during the coating, the sinter paste including the at least one of copper particles and silver particles with a diameter between 10 nm and 1000 µm is used.

8. The method according to claim 1, wherein:
during the pre-treating, a plurality of joining regions of the main surface are pre-treated simultaneously or in succession,
during the coating, the plurality of pre-treated joining regions of the main surface are coated with the sinter paste of at least one of copper particles and silver particles,
during the positioning, a plurality of power electronic units are positioned with the second contact side of the base plate on the main surface of the aluminium body in a corresponding one of the plurality of coated pre-treated joining regions,
during the joining, the plurality of power electronic units and the aluminium body are connected with one another in the plurality of coated pre-treated joining regions with supply of heat via the sinter paste in a materially bonded and heat-transferring manner.

9. The method according to claim 1, wherein the pre-treating of the joining region takes place by laser abrasion.

10. The method according to claim 1, wherein the sinter paste has copper particles with a diameter between 10 µm and 1000 µm.

11. The method according to claim 1, wherein the copper coating on the first contact side is structured with conductor tracks for the at least one electronic component.

12. The method according to claim 1, wherein the coating of the joining region with the sinter paste takes place by screen printing.

13. The method according to claim 1, wherein the base plate is an $Al_2O_3$ ceramic plate and is coated on the second contact side with a further copper coating so that the copper coating on the first contact side is electrically insulated by the ceramic plate from the further copper coating on the second contact side and the aluminium body.

14. The method according to claim 1, wherein the base plate is a steel or aluminium plate with a dielectric insulating layer facing the copper coating, so that the copper coating on the first contact side is electrically insulated by the insulating layer from the steel or aluminium plate and from the aluminium body.

15. The method according to claim 7, wherein a proportion of the at least one of copper particles and silver particles with the diameter between 10 nm and 1000 nm is between 0.5 mass % and 50 mass %.

16. A method for producing an electronic arrangement, comprising:
providing a plate-like aluminium body and at least one power electronic unit,
wherein the at least one power electronic unit has a base plate with a first contact side and a second contact side lying opposite thereto, and at least one electronic component,
wherein at least the first contact side of the base plate is coated with a copper coating,
wherein the at least one electronic component on the first contact side of the base plate is soldered-on or sintered-on onto the copper coating,
wherein the base plate and the power electronic unit with the second contact side are connected with a main surface of the aluminium body in a materially bonded and heat-transferring manner,
pre-treating a joining region of the main surface of the aluminium body for the at least one power electronic unit,
coating the pre-treated joining region of the main surface with a sinter paste including at least one of copper particles and silver particles, the at least one of the copper particles and the silver particles having a diameter between 10 nm and 1000 µm,
positioning the at least one power electronic unit with the second contact side of the base plate on the main surface of the aluminium body in the coated pre-treated joining region,
joining the at least one power electronic unit and the aluminium body in the coated pre-treated joining region with a supply of heat, wherein the aluminium body and the at least one power electronic unit are connected via the sinter paste in a materially bonded and heat-transferring manner, and
wherein the supply of heat is applied to the sinter paste after the positioning of the at least one power electronic unit on the aluminum body such that the sinter paste is fluid or pasty before the joining and forms a solid sinter layer after the joining to connect the at least one power electronic unit to the aluminium body.

17. The method according to claim 16, wherein a proportion of the at least one of copper particles and silver particles with the diameter between 10 nm and 1000 nm is between 0.5 mass % and 50 mass %.

18. The method according to claim 16, wherein the pre-treating of the joining region of the main surface is performed before the coating of the joining region.

19. The method according to claim 18, wherein the pre-treating of the joining region takes place by a chemical etching or by a mechanical abrasion.

20. The method according to claim 16, wherein the at least one power electronic unit and the aluminium body are joined together without being pressed against one another.

* * * * *